United States Patent [19]

Poff

[11] 4,409,732

[45] Oct. 18, 1983

[54] CIRCUIT ISOLATOR

[75] Inventor: Gary D. Poff, Fontana, Calif.

[73] Assignees: John Grant, Brea; Darryl J. Trulin, Upland, both of Calif.

[21] Appl. No.: 222,384

[22] Filed: Jan. 5, 1981

[51] Int. Cl.³ .............................................. H01R 43/00
[52] U.S. Cl. ...................................... 29/825; 81/3 R; 174/138 D; 228/19
[58] Field of Search ...................... 29/825, 402.06, 739, 29/839, 764; 228/19, 20; 174/68.5, 138 D; 81/3 R; 219/230

[56] References Cited

U.S. PATENT DOCUMENTS

| | | | |
|---|---|---|---|
| 3,045,336 | 7/1962 | Northrop et al. | 29/839 X |
| 3,114,026 | 12/1963 | Fortune | 219/230 X |
| 3,279,044 | 10/1966 | Roper | 29/739 |
| 3,466,732 | 9/1969 | Taylor | 174/68.5 X |
| 3,543,990 | 12/1970 | Fortune | 228/19 X |
| 3,549,078 | 12/1970 | Fortune | 228/19 X |
| 3,618,846 | 11/1971 | Poli | 228/20 X |
| 3,963,897 | 6/1976 | Wakita et al. | 219/236 X |

FOREIGN PATENT DOCUMENTS

| | | | |
|---|---|---|---|
| 2505241 | 8/1976 | Fed. Rep. of Germany | 228/264 |
| 1051447 | 12/1966 | United Kingdom | 29/825 |

*Primary Examiner*—Gene Crosby
*Assistant Examiner*—Carl J. Arbes

[57] ABSTRACT

An isolator device to electrically insulate and isolate a separate component in a circuit board arrangement to allow for relatively fast and convenient diagnostic inspection of a circuit to locate failed components. The device has an isolator sleeve with a cavity which receives the lead of the component while the lead is in situ on the board. The component lead is electrically insulated from the board circuitry to permit separate testing of the component's integrity.

1 Claim, 2 Drawing Figures

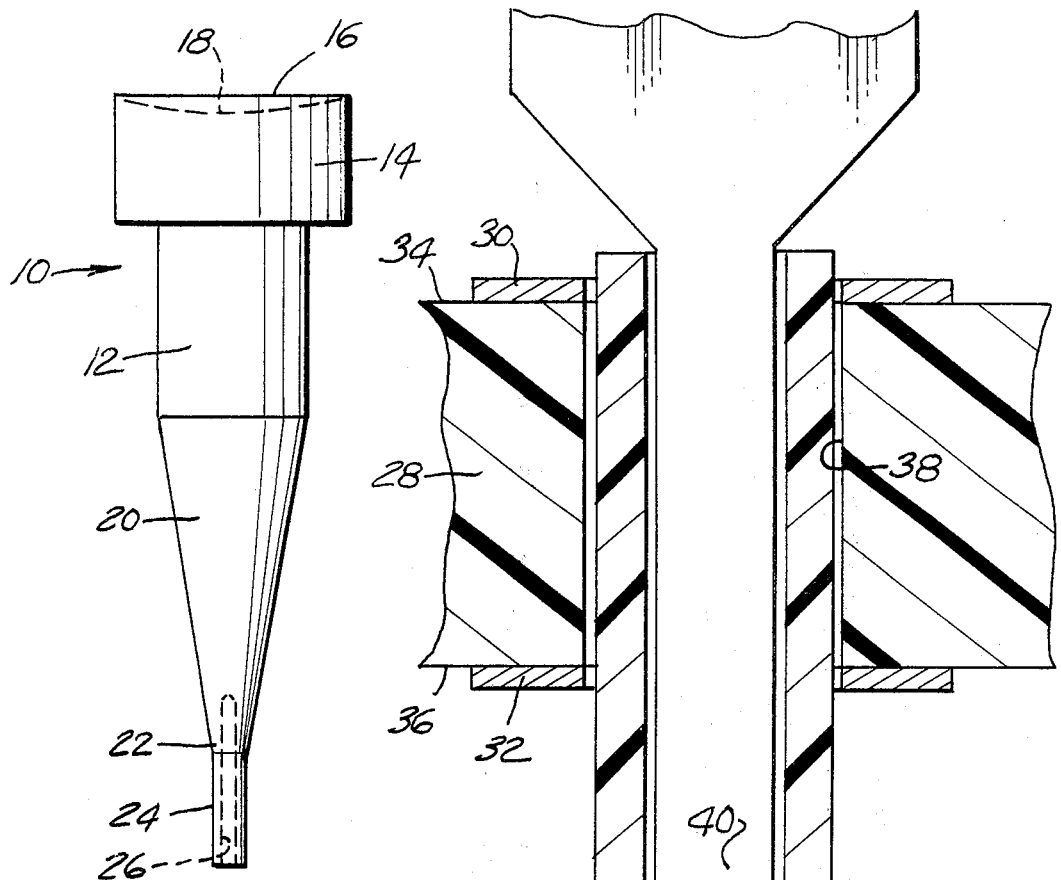

CIRCUIT ISOLATOR

BACKGROUND OF THE INVENTION

The present invention is directed to devices used in investigating circuit failures and, more particularly, to a device to allow convenient systematic isolation of each component in a circuit board to locate a failed component.

The electrical industry is extremely competitive, requiring continued efforts to reduce costs in order to maintain reasonable earning levels. Typically, the operation of many machines and systems in the present-day world depends upon the proper working of complex electrical circuitry, containing a multitude of electrical components on circuit boards.

During testing and final assembly of these machines and systems, failures often occur, requiring either expensive troubleshooting and rework of the entire circuit or disposal of the failed circuit board or unit. Such failures, unfortunately, contribute to additional expense in the overall production of these machines and systems. Present methods to approach the investigation or troubleshooting of failed circuits are unsatisfactory from both a quality standpoint and a cost standpoint.

In one prevalent method of troubleshooting a circuit, a technician or engineer, relying on experience and known facts, makes an educated guess as to where the probable failure is located in the circuit. Too often, this somewhat "guess" method does not locate the failure, and must be repeated on a hit-or-miss basis. Valuable time is wasted and good components may be disturbed in such a manner that they may be damaged. In this troubleshooting method, the solder connecting the component to the circuit is removed and the component leads are forced out of the board. If the leads do not break and are reinserted after testing, the physical integrity of the leads is in doubt. Later testing may result in a failure to the circuit caused by a fractured, reinserted component lead.

Another troubleshooting method is to completely remove and replace all components in a failed circuit. Much time is used and many possibly good components are wasted. In addition, new failure sources may be introduced by the insertion of new components, any of which may be defective.

Prior to the present invention, no sure and inexpensive method of locating component failures at the circuit level was known.

SUMMARY OF THE INVENTION

The present invention is a unique isolator device which quickly and conveniently allows in situ electrical insulation and isolation of a component on the circuit board. The isolator device has a sleeve forming a cavity which receives the component lead when the solder connecting the lead to the circuit has been removed. The sleeve is positioned through the circuit board to surround the lead and isolate it in place on the board.

Use of the present invention permits the systematic checking of all components in a failed circuit without the need to remove each component from the board for testing. This eliminates potential damage to the component and its connecting leads, avoiding costly waste if the component is otherwise good. The time for checking the components is reduced, since no time is spent removing and replacing components on the board.

The guesswork approach to troubleshooting can be eliminated because of the overall time saved with using the isolator device. Further, the approach of removing and replacing all components on a failed circuit board can be abandoned, eliminating possible damage to many good components.

The present isolator device allows for the checking of each component in-place on the board, while maintaining not only the quality of the component connection to the circuit on reconnection with solder, but also the cosmetic appearance of the board.

BRIEF DESCRIPTION OF THE DRAWINGS

FIG. 1 is a side elevational view of the isolator of this invention; and

FIG. 2 is a greatly enlarged, fragmentary sectional view of the sleeve portion of the isolator, inserted into a component lead in a circuit board.

DETAILED DESCRIPTION OF THE INVENTION

The isolator device 10 of the present invention is shown in FIG. 1 having the general shape of a golf tee. The isolator 10 has a generally cylindrical shank 12, to which is connected an enlarged cylindrical head portion 14. The outside face 16 of the head portion has a depression 18 to enhance the operator's grip and use of the isolator as will be explained later herein.

Extending downwardly from the bottom end of shank 12 is a frusto-conical, or tapered portion 20, which tapers the shank 12 down to a smaller diameter end portion 22. Projecting from the smaller end portion 22 is a cylindrical sleeve 24 having a cylindrical cavity 26. Cavity 26 extends the complete length of sleeve 24, and partially into the tapered portion 20.

The isolator device 10 is preferably made of a non-conductive plastic material such as Nylon, Teflon, or Delron. The isolator could be manufactured by injection molding or precision machining, with the former being preferred.

When an electrical circuit board to be placed in a machine or other system, being assembled, fails because one of the many components in the board is defective, one or several isolators 10 can be used to accomplish a systematic search for the location of the failed component. To insure a correct diagnosis of each component, the leads of the component must be sequentially isolated from the circuitry on the board in order to independently test each component so as to locate the malfunctioning component.

In FIG. 2 a circuit board 28 is shown, having circuitry interface contacts 30 and 32 on respective opposite sides 34 and 36 of the board. An aperture 38 in the board 28 is designed to receive the lead 40 of a component (not shown). Solder (not shown) is placed at the interface of the lead 40 and the circuit contacts 30 and 32 to electrically connect the component to the circuit.

The solder has been removed in FIG. 2 to show the use of the isolator 10. The sleeve 24 is inserted through the aperture 38 in board 28, and over the lead 40, so that the lead 40 is entirely confined within the cavity 26, and is surrounded by the sleeve, thereby electrically isolating the component lead 40 from the board circuit contacts 30 and 32. The depression 18 (in FIG. 1) in the handle portion 14 aids the user in the placement of his fingertips to properly guide the isolator through the board 28 in FIG. 2. The proper troubleshooting test can be quickly accomplished on the component. The testing can be done on the component with lead 40 and another lead of the component (not shown) with another isolator 10 without removing the components from the board, thus avoiding any possible damage to the leads of the component as when they are removed and reinserted.

Once the testing of the component in situ on the board 28 has been completed, and the component found in good shape, the isolator 10 is removed and solder is again placed at the interface of lead 40 and circuitry contacts 30 and 32 to provide electrical interconnection. The operator proceeds to another component and repeats the test procedure, using one or more isolators 10.

The inside diameter and length of the isolator cavity 26 are designed to accommodate all standard component leads. The outside diameter of the sleeve 24 is designed to allow insertion into the apertures of most standard printed circuit boards. In a preferred design of the present isolator 10, its length is approximately one inch, while the outside diameter of the sleeve 24 is 0.036 inch, and the diameter of the cavity 26 is 0.024 inch. The cavity 26 has a length of approximately 0.250 inch.

While I have shown and described in considerable detail what I believe to be the preferred form of my invention, it will be apparent to those skilled in the art that the invention is not limited to such details, but may take various other forms within the scope of the claims.

What I claim is:

1. A method for isolating the lead of a separate component soldered to a circuit board from the total circuit in order to inspect the operation of said component, said method using a generally elongated isolator device having an isolator sleeve at one end forming an isolator cavity, said method comprising the steps of:
   removing the solder from the interface of said lead and said circuit on said board;
   aligning said isolator sleeve with said lead in said board;
   pushing said sleeve onto said lead to enclose said lead within said isolator cavity; and
   simultaneously forcing said sleeve completely through said board to electrically isolate said lead from said circuit on said circuit board.

* * * * *